(12) United States Patent
Stern et al.

(10) Patent No.: US 11,870,216 B2
(45) Date of Patent: Jan. 9, 2024

(54) COMPACT NARROW-LINEWIDTH INTEGRATED LASER

(71) Applicant: The Trustees of Columbia University in the City of New York, New York, NY (US)

(72) Inventors: Brian Stern, New York, NY (US);
Xingchen Ji, New York, NY (US);
Michal Lipson, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 140 days.

(21) Appl. No.: 16/651,673

(22) PCT Filed: Sep. 28, 2018

(86) PCT No.: PCT/US2018/053425
§ 371 (c)(1),
(2) Date: Mar. 27, 2020

(87) PCT Pub. No.: WO2019/216948
PCT Pub. Date: Nov. 14, 2019

(65) Prior Publication Data
US 2020/0259313 A1  Aug. 13, 2020

Related U.S. Application Data (60) Provisional application No. 62/565,839, filed on Sep. 29, 2017.

(51) Int. Cl.
*H01S 5/14* (2006.01)
*H01S 5/0683* (2006.01)
(Continued)

(52) U.S. Cl.
CPC ............ *H01S 5/141* (2013.01); *H01S 5/0234* (2021.01); *H01S 5/02325* (2021.01);
(Continued)

(58) Field of Classification Search
CPC .... H01S 5/141; H01S 5/02325; H01S 5/0234; H01S 5/06837; H01S 5/1028; H01S 5/142; H01S 5/3013
See application file for complete search history.

(56) References Cited

U.S. PATENT DOCUMENTS 6,690,687 B2   2/2004   Ksendzov et al.
8,964,802 B1   2/2015   Caprara
(Continued)

FOREIGN PATENT DOCUMENTS

CN   101272033 A   9/2008
EP   1906497 A1    4/2008

OTHER PUBLICATIONS

Biberman et al., "Ultralow-loss silicon ring resonators," Opt. Lett., vol. 37, (2012), pp. 4236-4238.
(Continued)

*Primary Examiner* — Yuanda Zhang
(74) *Attorney, Agent, or Firm* — BakerHostetler (57) ABSTRACT

An on-chip laser includes a gain portion, a mirror in communication with the gain portion, a waveguide in communication with the gain portion, and a resonator optically coupled to the waveguide at an optical coupling. The resonator has a circular shape. The waveguide and the resonator are separate from the gain portion.

19 Claims, 9 Drawing Sheets

(51) Int. Cl.
H01S 5/10 (2021.01)
H01S 5/0234 (2021.01)
H01S 5/02325 (2021.01)
H01S 5/30 (2006.01)
(52) U.S. Cl.
CPC ........ *H01S 5/06837* (2013.01); *H01S 5/1028* (2013.01); *H01S 5/142* (2013.01); *H01S 5/3013* (2013.01)

(56) References Cited

U.S. PATENT DOCUMENTS

| | | | |
|---|---|---|---|
| 9,551,832 B1* | 1/2017 | Bovington | ......... G02B 6/12007 |
| 2003/0202555 A1 | 10/2003 | Liu et al. | |
| 2005/0089292 A1 | 4/2005 | Kinoshita | |
| 2009/0022445 A1 | 1/2009 | Hochberg et al. | |
| 2009/0122817 A1* | 5/2009 | Sato | ................... G02B 6/12007 |
| | | | 372/20 |
| 2012/0281957 A1* | 11/2012 | Chamanzar | ........ G02B 6/12007 |
| | | | 977/773 |
| 2014/0321485 A1 | 10/2014 | Seidel et al. | |
| 2015/0222089 A1* | 8/2015 | Jeong | ........................ H01S 5/14 |
| | | | 359/346 |
| 2015/0333479 A1 | 11/2015 | Liang et al. | |
| 2016/0049767 A1 | 2/2016 | Morton et al. | |
| 2016/0380408 A1 | 12/2016 | Zhang et al. | |
| 2017/0018903 A1 | 1/2017 | Vasilyev et al. | |
| 2017/0207600 A1 | 7/2017 | Klamkin et al. | |
| 2017/0324218 A1* | 11/2017 | Krishnamoorthy | .......................... |
| | | | H01S 3/10069 |

OTHER PUBLICATIONS

Bloom et al., "An optical lattice clock with accuracy and stability at the 10-18 level," Nature, vol. 506, (2014), pp. 71-75.
Borselli et al., "Beyond the Rayleigh scattering limit in high-Q silicon microdisks: theory and experiment," Opt. Express, vol. 13, (2005), pp. 1515-1530.
Dale et al., "Ultra-Narrow Line Tunable Semiconductor Lasers for Coherent LIDAR Applications," in Imaging and Applied Optics 2014 (2014), Paper JTu2C.3 (Optical Society of America, 2014), p. JTu2C.3.
Doerr et al., "Single-Chip Silicon Photonics 100-Gb/s Coherent Transceiver," in Optical Fiber Communication Conference: Postdeadline Papers (2014), Paper Th5C.1 (Optical Society of America, 2014), p. Th5C.1.
Dong et al., "Monolithic Silicon Photonic Integrated Circuits for Compact 100+ Gb/s Coherent Optical Receivers and Transmitters," IEEE J. Sel. Top. Quantum Electron, vol. 20, (2014), pp. 150-157.
Fan et al., "290 Hz intrinsic linewidth from an integrated optical chip-based widely tunable InP-Si3N4 hybrid laser," Conference on Lasers and Electro-Optics, No. JTh5C.9, (May 2017).
Fan et al., "A hybrid semiconductor-glass waveguide laser," in Proc. SPIE., vol. 9135, (2014).
Fan et al., "Optically Integrated InP Si3 N4 Hybrid Laser," IEEE Photonics J., vol. 8, (2016), pp. 1-11.
Fujioka et al., "Compact and Low Power Consumption Hybrid Integrated Tunable Laser Module Using Silicon Waveguide Resonators," J. Light. Technol., vol. 28, (2010), pp. 3115-3120.
Henry, "Theory of the linewidth of semiconductor lasers," IEEE J. Quantum Electron, vol. 18, (1982), pp. 259-264.
Ilchenko et al., "Compact tunable kHz-linewidth semiconductor laser stabilized with a whispering-gallery mode microresonator," Proceedings of SPIE, vol. 7913, (Feb. 19, 2011), No. 79131G.
Ji et al., "Ultra-low-loss on-chip resonators with sub-milliwatt parametric oscillation threshold," Optica., vol. 4, (2017), pp. 619-624.
Kazarinov et al., "The relation of line narrowing and chirp reduction resulting from the coupling of a semiconductor laser to passive resonator," IEEE J. Quantum Electron, vol. 23, (1987), pp. 1401-1409.

Kieu et al., "Fiber laser using a microsphere resonator as a feedback element," Optics Letters, vol. 32, Issue 3, (Feb. 1, 2007), pp. 244-246.
Kippenberg et al., "Modal coupling in traveling-wave resonators," Opt. Lett., vol. 27, (2002), pp. 1669-1671.
Kobayashi et al., "Silicon Photonic Hybrid Ring-Filter External Cavity Wavelength Tunable Lasers," J. Light. Technol., vol. 33, (2015), pp. 1241-1246.
Komljenovic et al., "Widely Tunable Narrow-Linewidth Monolithically Integrated External-Cavity Semiconductor Lasers," IEEE J. Sel. Top. Quantum Electron, vol. 21, (2015), pp. 214-222.
Koninck et al., "Design of a Hybrid III-V-on-Silicon Microlaser With Resonant Cavity Mirrors," IEEE Photonics J., vol. 5, (2013), p. 2700413-2700413.
Kuhn et al., "Free-space cavity optomechanics in a cryogenic environment," Applied Physics Letters, vol. 104, Issue 4, (Jan. 27, 2014), No. 044102.
Lai et al., "Photonic crystal slot waveguide absorption spectrometer for on-chip near-infrared spectroscopy of xylene in water," Appl. Phys. Lett., vol. 98, (2011), 023304.
Lee et al., "Demonstration of 12.2% wall plug efficiency in uncooled single mode external-cavity tunable Si/III-V hybrid laser," Opt. Express, vol. 23, (2015), pp. 12079-12088.
Liang et al., "Whispering-gallery-mode-resonator-based ultranarrow linewidth external-cavity semiconductor laser," Opt. Lett., vol. 35, (2010), pp. 2822-2824.
Lim et al., "Chasing the thermodynamical noise limit in whispering-gallery-mode resonators for ultrastable laser frequency stabilization," Nat. Commun., vol. 8, (2017).
Liu et al., "Passive microring-resonator-coupled lasers," Appl. Phys. Lett., vol. 79, (2001), pp. 3561-3563.
Okoshi et al., "Novel method for high resolution measurement of laser output spectrum," Electron. Lett., vol. 16, (1980), pp. 630-631.
Oldenbeuving et al., "25 kHz narrow spectral bandwidth of a wavelength tunable diode laser with a short waveguide-based external cavity," Laser Phys. Lett., vol. 10, (2013), 015804.
Padmaraju et al., "Thermal stabilization of a microring modulator using feedback control," Opt. Express, vol. 20, (2012), pp. 27999-28008.
Prtljaga et al., "On-chip interference of single photons from an embedded quantum dot and an external laser," Appl. Phys. Lett., vol. 108, (2016), 251101.
Puttnam et al., "2.15 Pb/s transmission using a 22 core homogeneous single-mode multi-core fiber and wideband optical comb," in 2015 European Conference on Optical Communication (ECOC), (2015), pp. 1-3.
Seimetz et al., "Laser Linewidth Limitations for Optical Systems with High-Order Modulation Employing Feed Forward Digital Carrier Phase Estimation," in OFC/NFOEC 2008-2008 Conference on Optical Fiber Communication/National Fiber Optic Engineers Conference (2008), pp. 1-3.
Spencer et al., "Stabilization of heterogeneous silicon lasers using Pound-Drever-Hall locking to Si3N4 ring resonators," Opt. Express, vol. 24, (2016), pp. 13511-13517.
Srinivasan et al., "Coupled-ring-resonator-mirror-based heterogeneous III-V silicon tunable laser," IEEE Photonics Journal, vol. 7, Issue 3, (Jun. 2015), pp. 1-8.
Stern et al., "Compact narrow-linewidth integrated laser based on a low-loss silicon nitride ring resonator," Optics Letters, vol. 42, Issue 21, (2017), pp. 4541-4544.
Tan et al., "Group velocity dispersion and self phase modulation in silicon nitride waveguides," Appl. Phys. Lett., vol. 96, (2010), 061101.
Wang et al., "Room-temperature InP distributed feedback laser array directly grown on silicon," Nat. Photonics, vol. 9, (2015), pp. 837-842.
White et al., "Refractometric Sensors for Lab-on-a-Chip Based on Optical Ring Resonators," IEEE Sens. J., vol. 7, (2007), pp. 28-35.
Xie et al., "Extended ultrahigh-Q-cavity diode laser," Opt. Lett., vol. 40, (2015), pp. 2596-2599.
Yang et al., "A single adiabatic microring-based laser in 220 nm silicon-on-insulator," Opt. Express, vol. 22, (2014), pp. 1172-1180.

(56) References Cited

OTHER PUBLICATIONS

Zhao et al., "Narrow-linewidth widely tunable hybrid external cavity laser using Si3N4/SiO2 microring resonators," in 2016 IEEE 13th International Conference on Group IV Photonics (GFP) (2016), pp. 24-25.

* cited by examiner

COMPACT NARROW-LINEWIDTH INTEGRATED LASER

CROSS-REFERENCE TO RELATED APPLICATIONS

This application is the National Stage Application of International Patent Application No. PCT/US2018/053425 filed Sep. 28, 2018, which claims the benefit of U.S. Provisional Application No. 62/565,839, filed Sep. 29, 2017, which is hereby incorporated by reference in its entirety.

GOVERNMENT RIGHTS

This invention was made with government support under HR0011-16-C-107 awarded by the Defense Advanced Research Projects Agency. The government has certain rights in the invention.

TECHNICAL FIELD

This disclosure pertains to compact narrow-linewidth lasers, particularly to such lasers that are integrated onto a micro-chip.

BACKGROUND

Narrow linewidth lasers are critical for a wide range of applications that require either long coherence lengths or superior phase sensitivity. These include optical communications, sensing, spectroscopy, light detection and ranging (LIDAR), quantum optics, and atomic clocks. Optical communications are of particular interest as network capacity demands rapidly grow. In order to expand the capacity of long-haul, metro, and short distance optical links, advanced modulation formats using coherent systems have emerged. Such formats modulate phase in addition to amplitude in order to increase aggregate data rates. This reliance on phase sets stricter requirements for laser linewidth. For example, 16-state quadrature amplitude modulation (16 QAM) can require linewidths below 100 kHz, and higher formats have requirements down to the single kHz level, far narrower than the approximately 1 MHz linewidth of typical DBR or DFB lasers.

SUMMARY

In meeting the described long-felt needs, the present disclosure provides an example on-chip laser. The laser may comprise a gain portion, a mirror in communication with the gain portion, a waveguide in communication with the gain portion, and a resonator optically coupled to the waveguide at an optical coupling. The resonator may have a circular shape. The waveguide and the resonator may be separate from the gain portion.

Also provided are microchips. An example microchip may comprise a laser having a laser cavity layer overlying or underlying a gain layer. The laser cavity layer and the gain layer may be substantially distinct layers. The gain layer may include a mirror. The laser cavity layer may comprise a waveguide in communication with the gain layer, and a resonator optically coupled to the waveguide at an optical coupling. The resonator may have a circular shape.

Additionally provided are methods of operating devices according to the present disclosure.

Additional advantages will be set forth in part in the description which follows or may be learned by practice. It is to be understood that both the foregoing general description and the following detailed description are exemplary and explanatory only and are not restrictive.

BRIEF DESCRIPTION OF THE DRAWINGS

The accompanying drawings, which are incorporated in and constitute a part of this specification, illustrate embodiments and together with the description, serve to explain the principles of the methods and systems.

DETAILED DESCRIPTION OF ILLUSTRATIVE EMBODIMENTS

The present disclosure may be understood more readily by reference to the following detailed description of desired embodiments and the examples included therein.

Unless otherwise defined, all technical and scientific terms used herein have the same meaning as commonly understood by one of ordinary skill in the art. In case of conflict, the present document, including definitions, will control. Preferred methods and materials are described below, although methods and materials similar or equivalent to those described herein can be used in practice or testing. All publications, patent applications, patents and other references mentioned herein are incorporated by reference in their entirety. The materials, methods, and examples disclosed herein are illustrative only and not intended to be limiting.

The singular forms "a," "an," and "the" include plural referents unless the context clearly dictates otherwise.

As used in the specification and in the claims, the term "comprising" may include the embodiments "consisting of" and "consisting essentially of." The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any impurities that might result therefrom, and excludes other ingredients/steps.

As used herein, the terms "about" and "at or about" mean that the amount or value in question can be the value designated some other value approximately or about the same. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

Unless indicated to the contrary, the numerical values should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 grams to 10 grams" is inclusive of the endpoints, 2 grams and 10 grams, and all the intermediate values). The endpoints of the ranges and any values disclosed herein are not limited to the precise range or value; they are sufficiently imprecise to include values approximating these ranges and/or values.

As used herein, approximating language may be applied to modify any quantitative representation that may vary without resulting in a change in the basic function to which it is related. Accordingly, a value modified by a term or terms, such as "about" and "substantially," may not be limited to the precise value specified, in some cases. In at least some instances, the approximating language may correspond to the precision of an instrument for measuring the value. The modifier "about" should also be considered as disclosing the range defined by the absolute values of the two endpoints. For example, the expression "from about 2 to about 4" also discloses the range "from 2 to 4." The term "about" may refer to plus or minus 10% of the indicated number. For example, "about 10%" may indicate a range of 9% to 11%, and "about 1" may mean from 0.9-1.1. Other meanings of "about" may be apparent from the context, such as rounding off, so, for example "about 1" may also mean from 0.5 to 1.4. Further, the term "comprising" should be understood as having its open-ended meaning of "including," but the term also includes the closed meaning of the term "consisting." For example, a composition that comprises components A and B may be a composition that includes A, B, and other components, but may also be a composition made of A and B only. Any documents cited herein are incorporated by reference in their entireties for any and all purposes.

The present disclosure relates to a compact, narrow-linewidth integrated laser. The laser may be based on low-loss silicon nitride waveguides coupled to a III-V semiconductor gain chip. By using a highly confined optical mode, the disclosed laser achieves compact bends and ultra-low loss. The laser may comprise a micro-ring resonator, such as a high-Q micro-ring resonator. The micro-ring resonator may be configured to provide narrowband back reflection. The narrowband backreflection may allow the micro-ring resonator to function as a cavity output mirror, a single-mode filter, a propagation delay, and/or a combination thereof. In one embodiment, this configuration allows the micro-ring to provide feedback and obtain a laser linewidth of 13 kHz with 1.7 mW output power around 1550 nm. This demonstration realizes a compact sub-mm silicon nitride laser cavity with narrow linewidth.

In systems integrating multiple lasers (e.g., wavelength-division multiplexing (WDM)), the realization of compact lasers enables scaling and cost reduction. Integrated, tunable lasers based on silicon photonics have been demonstrated using semiconductor materials, such as III-V semiconductor materials. These electrically-pumped lasers have achieved excellent output power, efficiency, and tuning range, with linewidths reaching below 10 kHz.

Compact narrow-linewidth lasers based on silicon nitride ($Si_3N_4$)—a CMOS-compatible, deposited material with low nonlinear losses—would provide numerous advantages over silicon for many applications. In contrast to silicon, $Si_3N_4$ is not limited by two-photon absorption or free-carrier absorption at higher powers, while still having a high index contrast (~0.5) allowing for compact devices. Additionally, silicon nitride's transparency extends to visible wavelengths, enabling additional applications. While $Si_3N_4$ integrated laser cavities reaching linewidths as low as 24 kHz have been demonstrated, these lasers rely on mode delocalization in order to achieve low loss, requiring long lengths or large areas (on the order of several $mm^2$) in order to ensure low bending losses.

Disclosed is a non-conventional laser that addresses the above problems. The laser may comprise a compact $Si_3N_4$ hybrid laser. The laser may be based on high-confinement waveguides. The waveguides may configure the laser to attain a low-loss, small footprint integrated laser cavity. The laser may comprise one or more $Si_3N_4$ waveguides with low propagation losses (e.g., 0.8 dB/m at 100 μm radius). The low propagation losses may be achieved by addressing sources of loss and confining the optical mode. Such high-confinement $Si_3N_4$ waveguides also compare favorably to silicon, which has only reached losses of 10-50 dB/m at compact dimensions or 3 dB/m at 5 mm size.

Figure 1A:
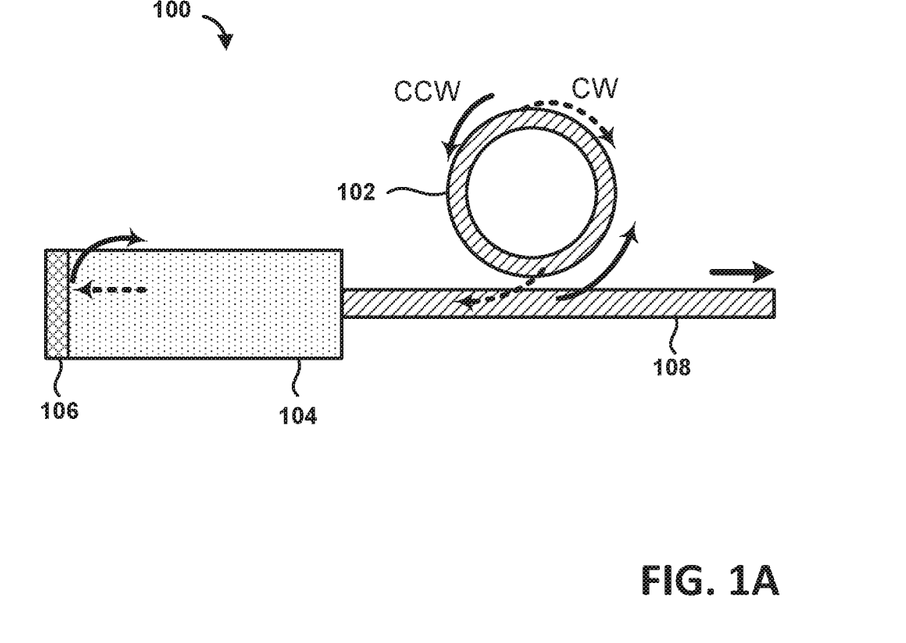
FIG. 1A is a schematic of an example laser.

FIG. 1A is a schematic of an example laser 100 in accordance with the present disclosure. The laser 100 may comprise a resonator 102. The resonator 102 may comprise a micro-ring resonator. The resonator 102 may comprise a high quality factor (Q) resonator. The Q factor may have a value large enough to cause reflection from the resonator 102. A high Q may comprise a Q high enough such that the nonlinear oscillation threshold power (e.g., which is a function of Q) is lower than the power that the laser can supply. The Q varies based on material, but as an example a high Q may comprise a Q greater than about 1 million, a Q greater than about 100,000, and/or the like. The resonator 102 may comprise silicon nitride ($Si_3N_4$). As an example, the resonator 102 may comprise a high quality factor (Q) $Si_3N_4$ micro-ring resonator. The resonator 102 may be configured as a combined filter, output mirror, and propagation delay (e.g., or any combination thereof) to achieve linewidth reduction.

The laser 100 may comprise a gain portion 104. The laser 100 may comprise a mirror 106. The mirror 106 may be highly reflective (e.g., 90% reflection or greater, 93% reflection). The mirror 106 may be disposed on (e.g., adjacent, affixed, coupled, adhering to) a first end of the gain portion 104. The laser 100 may comprise a waveguide 108. The waveguide 108 may be coupled to a second end of the gain portion 104. The second end may be opposite the first end. The waveguide 108 may comprise and/or be coupled to the resonator 102.

The laser 100 may include only a gain section and two mirrors, one of which is the resonator 102, as shown in FIG. 1A. The resonator 102 may be configured as a partial reflector. The resonator 102 may reflect light back to the laser cavity. The resonator 102 may reflect light based on a coupling of a counter clockwise (CCW) propagating mode to a clockwise (CW) propagating mode. The resonator 102 may be configured as a tunable filter. The resonator 102 may be tunable based on a coupling between the CCW propagation mode and the clockwise CW propagation mode. The CW propagation mode and CCW propagation modes may couple to each other when minor scattering points along the cavity dominate the losses (e.g., as opposed to material absorption or out-of-plane scattering). When the Q is sufficiently high, power may build up in the cavity such that light can fully couple from CW to CCW or the reverse, resulting in an effective reflection. The amount of reflection may be controlled based on the coupling strength between the CW propagation mode and CCW propagation mode. The amount of reflection may be controlled based on the Q relative to the coupling strength κ between the waveguide 108 and the resonator 102. Because the reflection has a narrow bandwidth, the resonator 102 may filter the cavity modes. Tuning the resonance of the resonator 102 allows the lasing wavelength to be selected.

To achieve a narrow laser linewidth, the resonator 102 (e.g., high-Q micro-ring) may be configured as an external cavity feedback (e.g., taking advantage of the long effective length of the ring). In semiconductor lasers, spontaneous emission events affect carrier density, resulting in refractive index and phase changes, thus broadening the linewidth. The resonator 102 may be configured as an external cavity that reduces linewidth broadening by making the lasing frequency less sensitive to phase and gain changes. Because frequency-dependent feedback contributes to linewidth reduction, the narrowband reflection from the resonator 102 makes an ideal external cavity. The low propagation loss and coupling strength of the resonator 102 effectively increases the cavity length. The effective length $L_{eff}$ of the resonator 102 is given by $$L_{eff} = \frac{\lambda}{\beta}\left|\frac{d\varphi}{d\lambda}\right| \quad \text{(Eq. 1)}$$

where β is the propagation constant. At critical coupling, this becomes $$L_{eff} = \frac{1-\kappa}{\kappa}L \quad \text{(Eq. 2)}$$

To achieve a large $L_{eff}$, the laser may be operated close to critical coupling with low coupling κ. The $L_{eff}$ provides the linewidth reduction benefits of a physically long external cavity, without the need for centimeters of on-chip space. Note that demonstrations using microcavities in lasers have previously achieved sub-kilohertz linewidths using feedback from $MgF_2$ or silica microsphere cavities with Q's on the order of 109 to achieve ultra-narrow resonances, but such materials are not planar and therefore not easily integrated on silicon substrates.

Figure 1B:
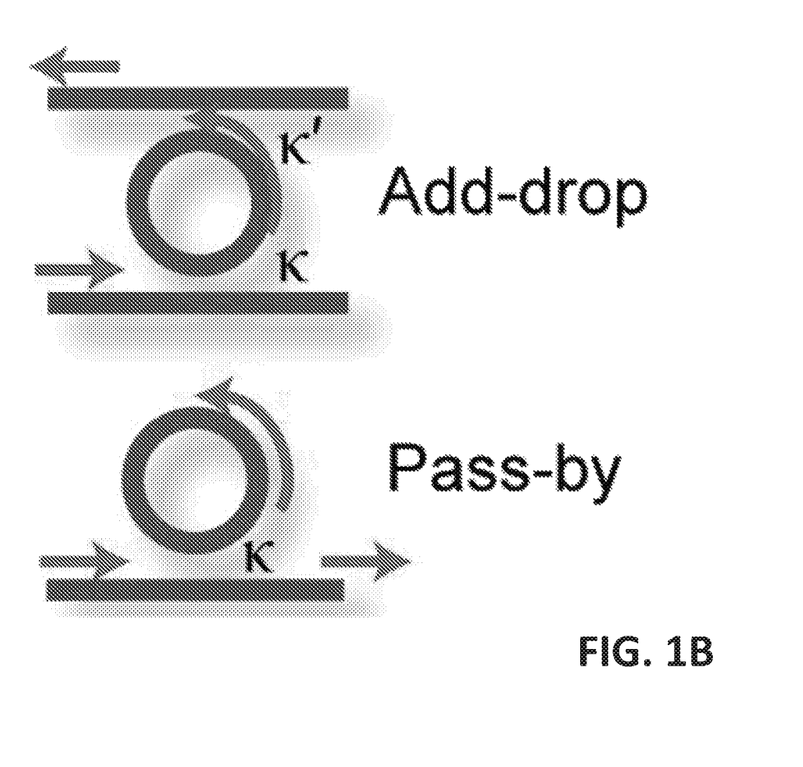
FIG. 1B shows a comparison of the pass-by configuration and a commonly used add-drop configuration.

FIG. 1B shows a comparison of the pass-by configuration used here (bottom), which leads to a high loaded Q, with the commonly used add-drop configuration (top), which often leads to a lower loaded Q. The term Q refers to the quality factor, a term known to those of skill in the art. A single waveguide 108 may be used to couple light in and out of the resonator 102. This approach may ensure that low-loss waveguides translate to a high loaded quality factor ($Q_L$) and narrow linewidth. This single waveguide approach may be in contrast to the more commonly used add/drop configuration formed by coupling the resonator 102 to two waveguides (as shown in FIG. 1B, top). In a single waveguide pass-by configuration (e.g., as shown in FIG. 1B, bottom), the coupling κ may match the roundtrip losses αL. The coupling κ may match the roundtrip losses αL to achieve critical coupling so that power builds up in the resonator 102. The resonator 102 may be operated in an undercoupled configuration, where κ is slightly less than αL. This leads to a high $Q_L$ close to the intrinsic $Q_0$, where $Q_L=Q_0/(1+\kappa/\alpha L)$. In contrast, the commonly used add-drop reasonator configuration shown in FIG. 1B (top) must meet the condition κ=κ'+αL for critical coupling. In this case, the coupling (κ≤κ') must be strong compared to αL to drop the power, and so even a low-loss platform may be limited to a $Q_L$ on the order of 105. The pass-by configuration may be used in the laser 100 to achieve a high $Q_L$ in the $10^7$ range, which takes advantage of $Si_3N_4$'s low loss. The $Q_L$ can also be in the range of about $10^6$ and about $10^8$.

Figure 1C:
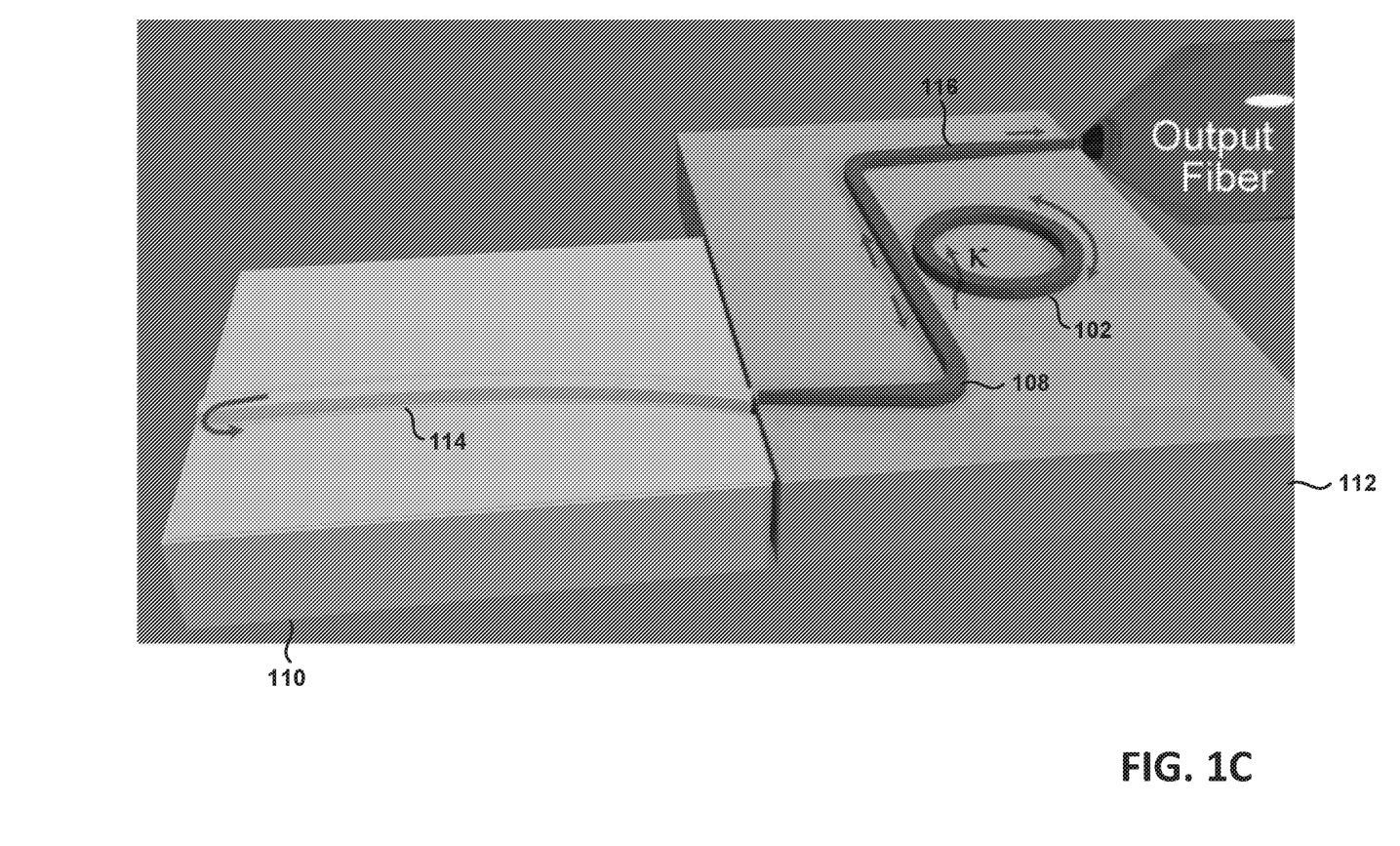
FIG. 1C is a schematic of an example laser cavity design.

FIG. 1C is a schematic of an example laser cavity design. It should be noted that this diagram may not be to scale. The example laser 100 may comprise a first chip portion 110. The first chip portion 110 may comprise the gain medium. The first chip portion 110 may comprise the mirror 106. The example laser 100 may comprise a second chip portion 112. The second chip portion 112 may comprise the resonator 102, the waveguide 108, and/or the like. The second chip portion 112 may comprise a silicon portion. The resonator 102 and/or waveguide 108 may be disposed on the silicon portion. The laser 100 may be formed by coupling the first chip portion 110 to the second chip portion 112.

The laser 100 may be formed by edge coupling the first chip portion 110 (e.g., the gain portion 104) to the second chip portion 112 (e.g., the waveguide 108, the resonator 102). For example, the gain portion 104 may be edge coupled to the waveguide 108 and/or resonator 102. As a non-limiting example, the first chip portion 110 and/or gain portion 104 may comprise a III-V reflective semiconductor optical amplifier (RSOA). The RSOA may be edge coupled to the second chip portion 112 (e.g., an external cavity). The second chip portion 112 may comprise silicon nitride ($Si_3N_4$). The second chip portion 112 may comprise a $Si_3N_4$ cavity, as shown in FIG. 1C. For example, the waveguide 108 and/or resonator 102 may comprise silicon nitride.

As a non-limiting example, the RSOA may be a commercially available RSOA (e.g., Thorlabs SAF1126) that provides gain across a 40 nm range near 1550 nm, for which the laser cavity may be designed. As a non-limiting example, the first chip portion 110 (e.g., the RSOA) may have a reflection (e.g., from the mirror 106) of 93% at one end (e.g., the first end). The first chip portion 110 may be anti-reflection coated on the other end (e.g., the end adjacent the waveguide 108). The first chip portion 110 (e.g., RSOA) may be coupled to the waveguide 108. The waveguide 108 may comprise a tapered waveguide. The taper may be fabricated at an angle with respect to the facet or end of the gain layer 104 and/or first chip portion 110 (e.g., to avoid reflections). The waveguide 108 may comprise a silicon nitride ($Si_3N_4$) waveguide. The first chip portion 110 may comprise an addition waveguide 114. The additional waveguide 114 may be coupled to the waveguide 108 of the second chip portion 112. The additional waveguide 114 may extend from an end adjacent the second chip portion 112 to a reflective end (e.g., or mirror). The waveguide 108 may comprise an output end 116 configured as an output of the laser. The output end 116 may be opposite an end configured to couple to the first chip portion 110. One or more of the ends of the waveguide 108 may be tapered (e.g., as described further herein). In other embodiments, the first chip portion 110 (e.g., the RSOA) and the second chip portion (e.g., $Si_3N_4$ cavity, resonator 102, waveguide 108) may be flip-chip bonded together, such as via a grating coupler and/or an angled facet for transmitting light between the first chip portion 110 and second chip portions 112 in a periscope-like manner.

Figure 2A:
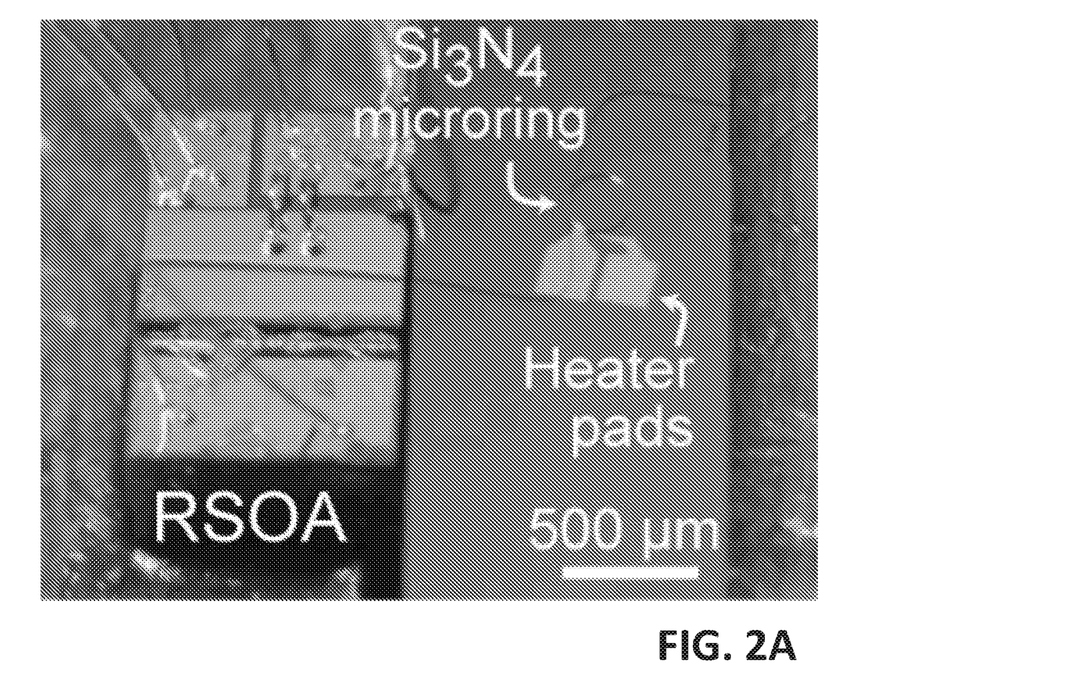
FIG. 2A shows an example laser in which a first chip portion and a second chip portion are coupled.
Figure 2B:
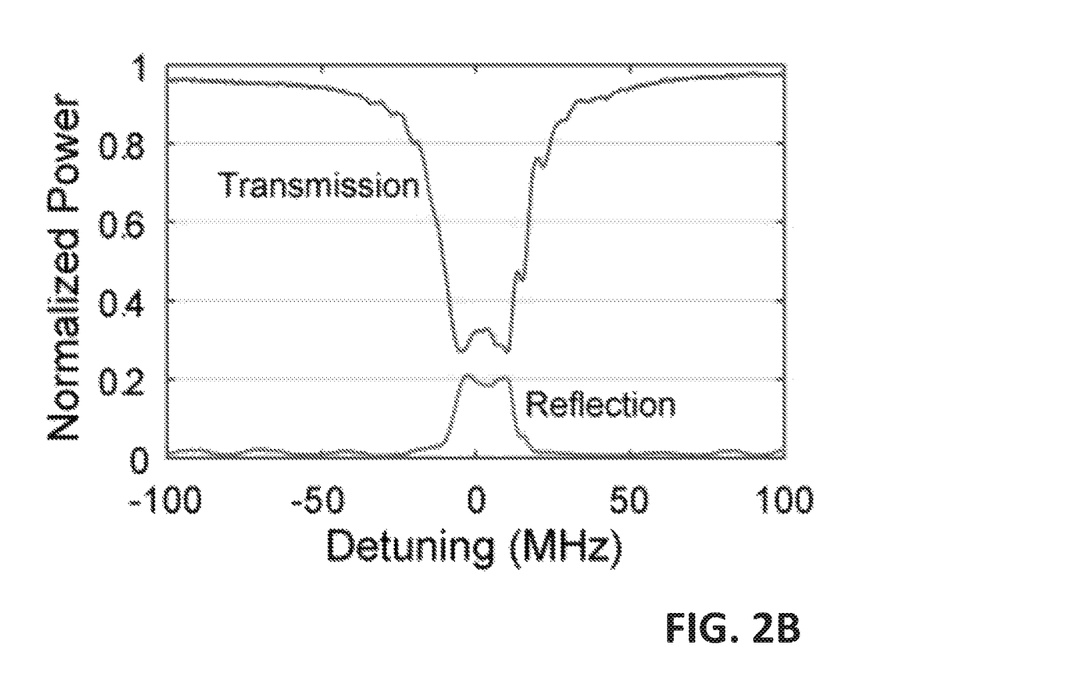
FIG. 2B is a graph of measured transmission and reflection spectra of an example $Si_3N_4$ micro-ring resonator.

FIG. 2A and FIG. 2B shows an example illustrated embodiment of a laser in accordance with the present disclosure. FIG. 2A shows an example laser in which a first chip portion and a second chip portion are coupled. Wirebonds may be used to supply current to the RSOA. Needle probes (not shown) may be used to apply voltage to the heater on the $Si_3N_4$ chip.

A 3-axis stage may be used to align the first chip portion (e.g., RSOA) to a facet of the second chip portion (e.g., silicon chip facet) as shown in FIG. 2A. The coupling loss was estimated to be 8.5 dB. This coupling loss can be improved by optimizing the tapered waveguide dimensions, as coupling loss below 1 dB has recently been demonstrated in hybrid lasers. The example waveguide (e.g., $Si_3N_4$ waveguide) may have a length of about 950 μm before coupling to a micro-ring resonator of about 120 μm radius. A coupling gap of about 480 nm and wide waveguides with cross-section of about 730×1800 nm (thickness×width) may be used to localize the optical mode. The output waveguide may be coupled to a lensed fiber to measure the output of the laser. Both the waveguide and the resonator (e.g., micro-ring) can have the same cross-section at the coupling (e.g., and elsewhere). Additionally, the waveguide can have the same or a different cross-section at the coupling with the gain. Moreover, in other embodiments, the waveguide length can be in the range of about 10 μm and about 1.0 cm, or even less than 10 μm; the coupling gap can be in the range of about 100 nm and about 1000 nm (1.0 μm); and, for the waveguide cross-section, the thickness can be in the range of about 10 nm and about 5 μm, and the width can be in the range of about 400 nm and about 5 μm. It is to be appreciated that the resonator can have other configurations. For example, the resonator can have a circular shape other than that of a planar ring, such as that of a disk or a toroidal shape. Additionally, the radius of the resonator can be as large as about 1.0 cm. In embodiments where the resonator is a ring or a disk, the top surface thereof can be substantially planar.

Referring again to the illustrated embodiment, the $Si_3N_4$ cavity may be fabricated using the process described in X. Ji et al., Optica 4, 619-624 (2017) to attain low loss waveguides. About 4 μm of $SiO_2$ may be grown on a silicon wafer. $Si_3N_4$ or other resonator material may then deposited using low-pressure chemical vapor deposition (LPCVD). The wafer may be annealed and chemical-mechanical polished (CMP). The waveguides may be patterned using electron beam lithography. The waveguides may be etched. The devices may be clad with $SiO_2$. The fabrication process may comprise pattern and lift-off of sputtered platinum heaters over the resonator (e.g., micro-ring) in order to tune the resonance. In other embodiments, the heaters can be located adjacent the waveguide and remote from the micro-ring so as to thermally tune the resonance waveguide. In further embodiments, one or more heaters can be located adjacent the micro-ring to tune the micro-ring while additional one or more heaters can be located adjacent the waveguide to tune the waveguide.

FIG. 2B is a graph of measured transmission and reflection spectra of an example $Si_3N_4$ micro-ring resonator. The degeneracy of the CW and CCW modes may cause the resonance splitting (double peak), which is accounted for in the resonance fitting. Referring again to the illustrated embodiment, quality factor of the $Si_3N_4$ micro-ring was measured to be $10^7$, which in the laser configuration corresponds to an effective length of over 1 meter. Using the measurements of the transmission of the example $Si_3N_4$ chip alone, shown in FIG. 2B, the micro-ring resonance bandwidth was fit to an 18 MHz Lorentzian, indicating a $Q_0$ of $1.34\times10^7$, a $Q_L$ of $1.05\times10^7$, and an ultra-low propagation loss of 2.2 dB/m. A circulator was used to measure the reflection spectrum of the micro-ring, which is shown in FIG. 2B. On resonance there is a strong 20% reflection. Using the $Q_L$ derived from the transmission, κ was determined to be about $1.1\times10^{-4}$. From Equation 1 and the transmission fitting, $L_{eff}$ is calculated to be 1.17 m, achieved in an area of about $4.5\times10^{-2}$ mm$^2$ on the chip.

Figure 3A:
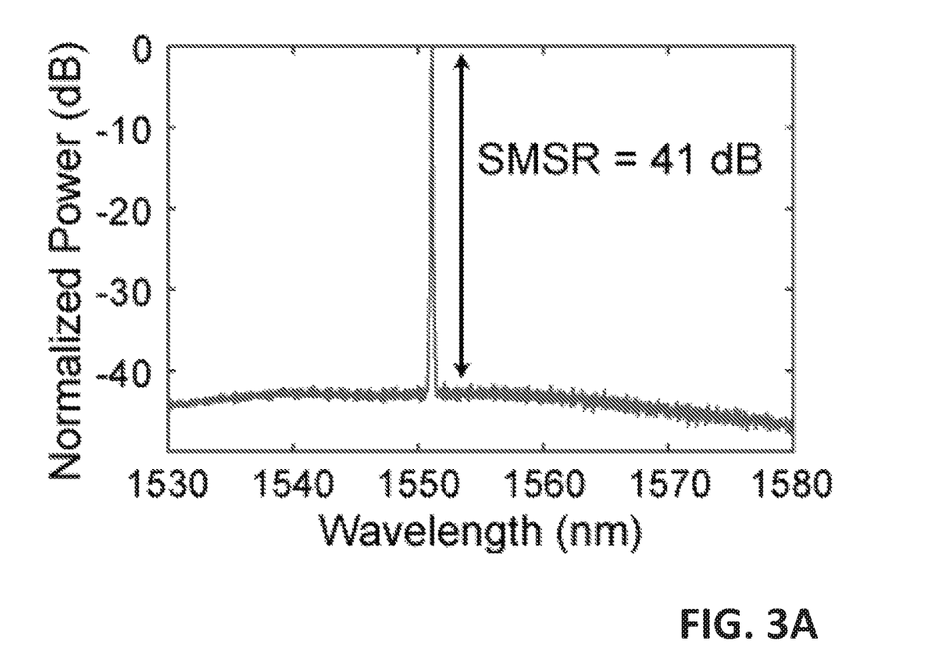
FIG. 3A is a graph of measured spectrum of laser output showing single-mode operation and high side mode suppression ratio (SMSR).
Figure 3B:
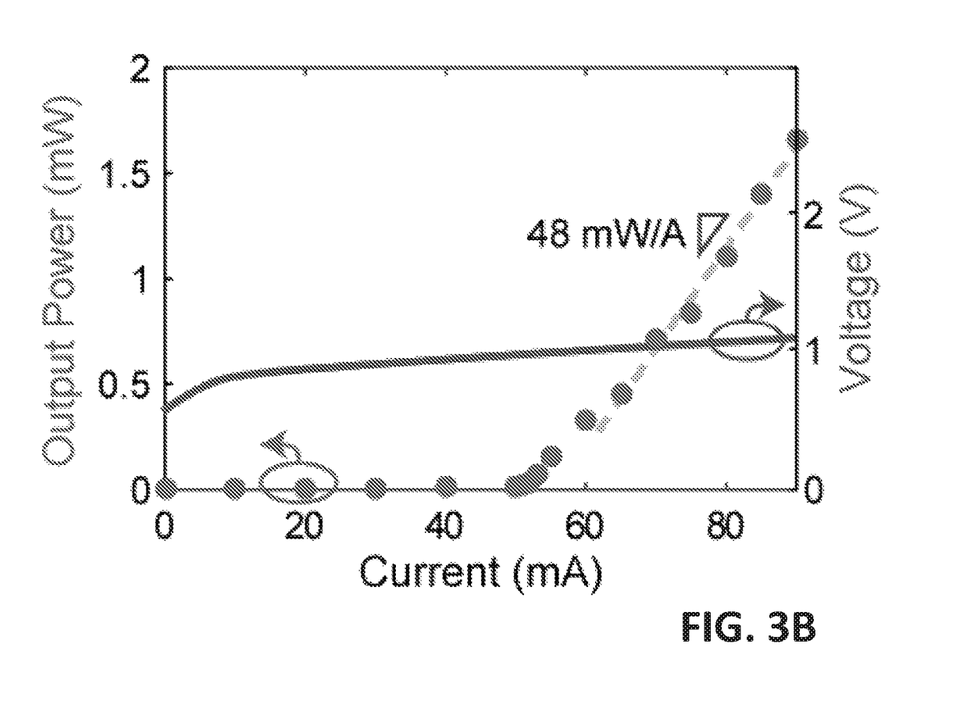
FIG. 3B is a graph of measured laser output power below and above threshold current.
Figure 3C:
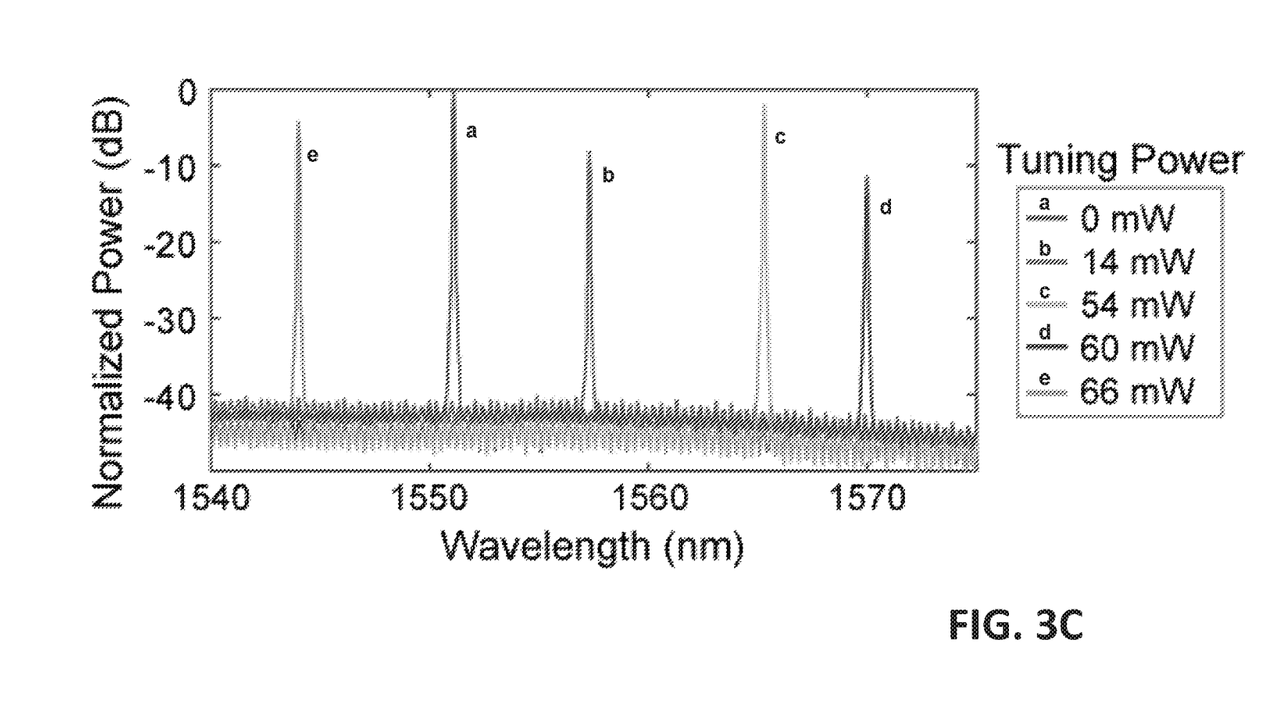
FIG. 3C is a graph of measured spectra showing lasing across a wide range of wavelengths.

Referring now to FIG. 3A, FIG. 3B, and FIG. 3C, single-mode lasing is shown with greater than 1 mW of output power when pumping the assembled laser above threshold. FIG. 3A is a graph of measured spectrum of laser output showing single-mode operation and high side mode suppression ratio (SMSR). The output of the laser is sent to an optical spectrum analyzer (OSA) to characterize the lasing spectrum, shown in FIG. 3A. The laser's side mode suppression ratio (SMSR) is 41 dB at 1550 nm. FIG. 3B is a graph of measured laser output power below and above threshold current. FIG. 3B shows the laser's output power versus pump current. The threshold current is 52 mA, above which the slope efficiency is 48 mW/A. The example laser, which is uncooled, has a maximum observed output power of 1.66 mW at 90 mA, with a wall-plug efficiency of 1.7%. In order to confirm that the ring is acting as an output mirror according to design, the RSOA was coupled to an identical $Si_3N_4$ waveguide, but with no on-chip ring. This confirmed that it does not lase simply due to facet reflections.

FIG. 3C is a graph of measured spectra showing lasing across a wide range of wavelengths. By adjusting the voltage applied to the micro-heater integrated on the ring, lasing is obtained at discrete wavelengths within a 27 nm range. FIG. 3C shows that as the resonance of the ring is tuned using the integrated heaters, lasing is observed at wavelengths from 1544 nm-1571 nm, a wide 27 nm range, although the tuning, while repeatable, does not continuously cover the whole tuning range. In additional embodiments, the resonance can be tuned so that the lasing occurs across a tunable wavelength range of about 80 nm.

Figure 4A:
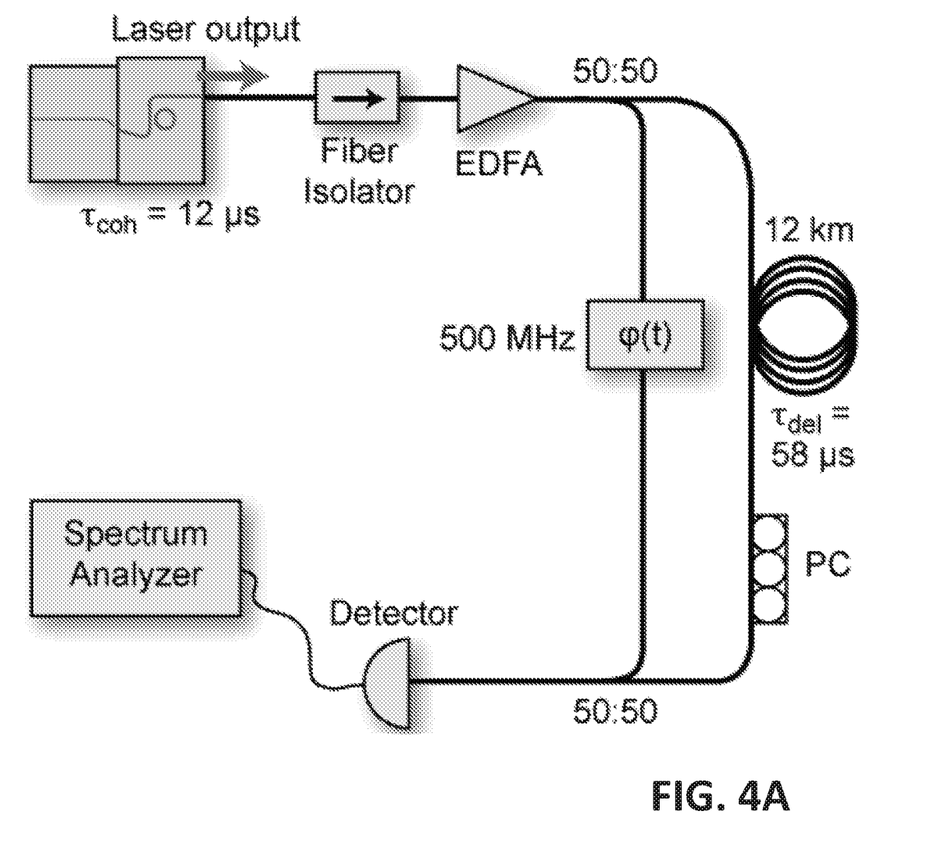
FIG. 4A is a diagram showing a delayed self-heterodyne (DSH) test set-up.
Figure 4B:
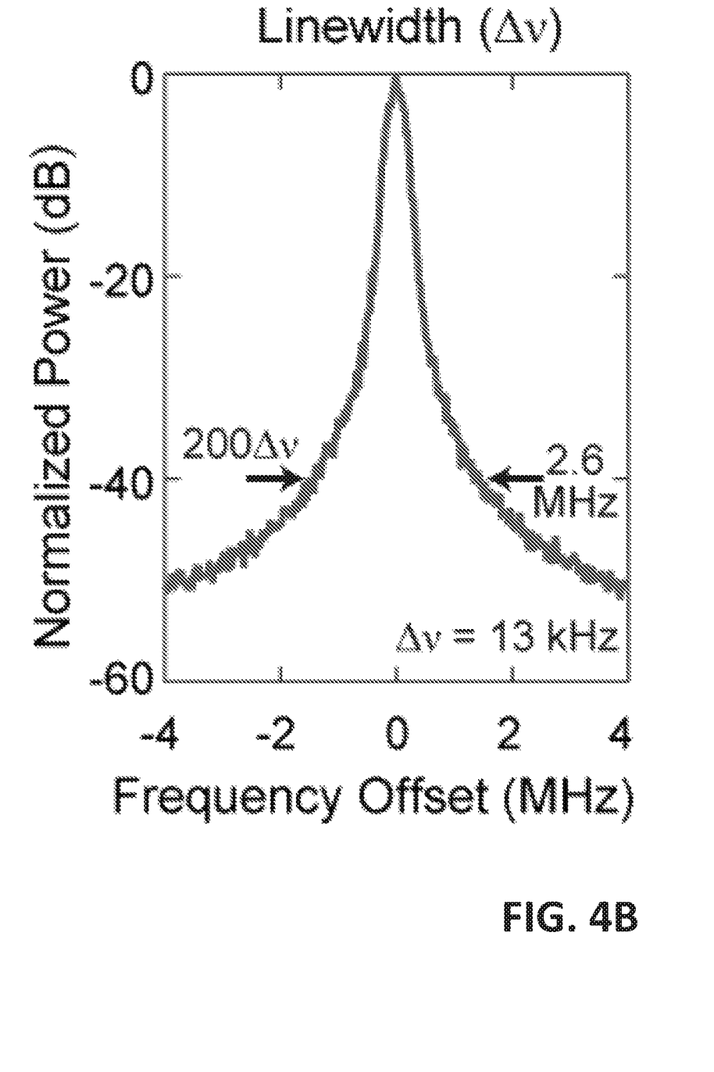
FIG. 4B is a graph showing a measured DSH beat note in RF spectrum analyzer.

Referring now to FIG. 4A and FIG. 4B, a 13 kHz linewidth is measured from the example laser using a delayed self-heterodyne (DSH) setup. The linewidth is narrower than the resolution of the available OSA, so DSH is performed because it allows measurement of narrow linewidths without the need for a reference laser at a nearby frequency. FIG. 4A shows a diagram of an experimental setup for measuring the laser. FIG. 4A is a diagram showing a delayed self-heterodyne (DSH) test set-up. The test set up may comprise an Erbium Doped Fiber Amplifier (EDFA) and a Polarization Controller (PC).

The laser output is sent to a fiber interferometer in which one path has a delay of 12 km, which is longer than the laser coherence length and allows reliable measurements for linewidths down to several kHz. FIG. 4B is a graph showing a measured DSH beat note in RF spectrum analyzer. The −40 dB width equals 200 times the Lorentzian linewidth, which is found to be 13 kHz here. The resolution bandwidth used is 10 kHz. FIG. 4B shows the measured beat note of the laser using this setup. A Lorentzian is fit to the beat note's tails, corresponding to a linewidth of 13 kHz, which is among the narrowest demonstrated in integrated lasers with widely adjustable wavelength. As set forth below, lower linewidths, as well as higher linewidths, are within the scope of the present disclosure. For example, the linewidth can be in the range of about 100 Hz and about 100 kHz, although lower and higher linewidths are possible.

Figure 5:
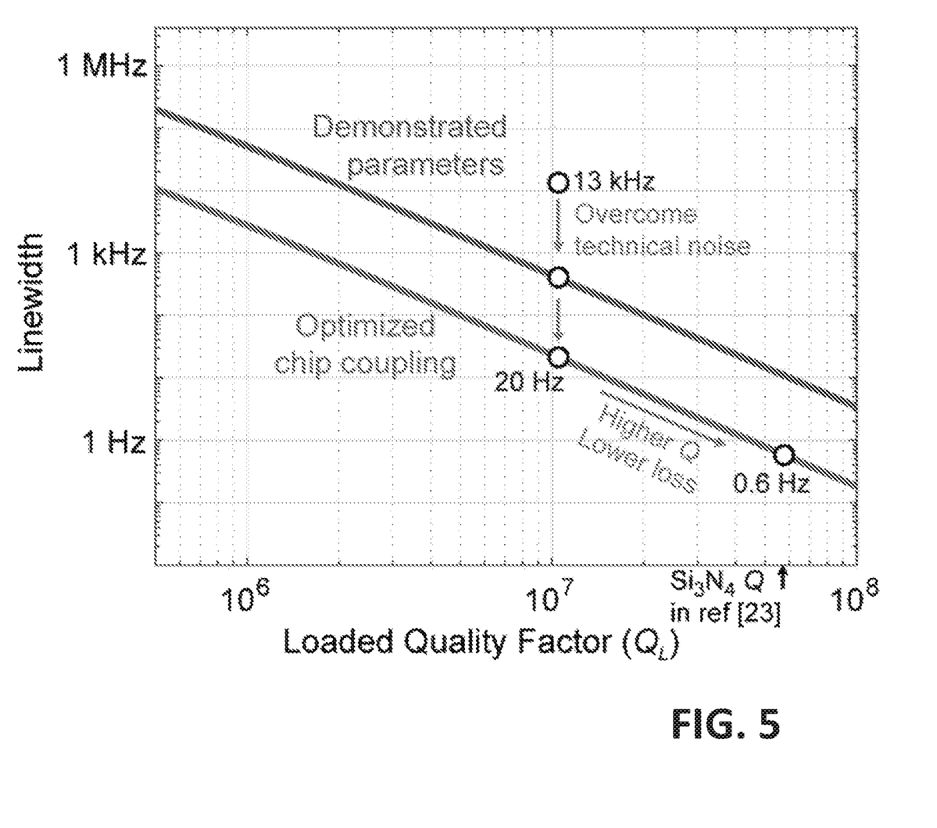
FIG. 5 is a graph showing calculated linewidth versus Q.

FIG. 5 is a graph showing calculated linewidth versus Q. Current cavity parameters are shown as the top line in graph. Improved coupling parameters are shown as the bottom line in the graph. Laser cavities based on $Si_3N_4$ have the potential to reach beyond the demonstrated 13 kHz linewidth and produce sub-Hz linewidths. A linewidth as narrow as 400 Hz may be achieved, and even narrower linewidths are attainable. Using the experimentally demonstrated cavity parameters, the predicted linewidth is plotted as a function of $Q_L$ in FIG. 5, using the Schawlow-Townes formula with Henry's linewidth broadening factor. For the $Q_L$ of $1.05 \times 10^7$ in this case, the expected linewidth is 400 Hz, indicating that the illustrative experiment may be limited by technical noise, such as vibrations or noise from the power supply driving the RSOA. Permanent bonding of the two chips or using a lower noise pump current supply may be useful. Also plotted in FIG. 5 is the achievable linewidths from optimized coupling of the gain chip to the silicon chip, which may be improved to 1 dB loss and 10 mW output power. This optimization is expected to yield a linewidth of 20 Hz for the same $Q_L$, and below 1 Hz for a $Q_L$ of $5.8 \times 10^7$. This $Q_L$ was achieved in $Si_3N_4$ in X. Ji et al., Optica 4, 619-624 (2017). Such ultra-narrow linewidths would be especially desirable for metrology applications. It is important to note that at these levels, factors such as acoustic noise and Brownian motion may also become limiting factors, but using a fully integrated platform aids one in addressing those challenges.

In summary, a compact $Si_3N_4$ laser cavity with narrow linewidth is demonstrated using the presently disclosed techniques. Using a highly confined optical mode enables both compact bends and ultra-low loss in $Si_3N_4$ waveguides. The example laser design leverages the narrowband reflection generated by backscattering in a high-Q $Si_3N_4$ microring to act as an output mirror and to provide laser linewidth reduction. The narrow resonance of the ring allows the laser to achieve singlemode lasing with a 41 dB SMSR. Lasing at discrete wavelengths, e.g., across a 27 nm range, has been shown. A larger continuous tuning range, for example, up to about 80 nm, may be achieved with additional cavity control that would include a tunable coarse filter. Further, an additional heater to tune the cavity phase would allow for more consistent output power while tuning. The laser has a measured 13 kHz linewidth, due to a high Q of over $10^7$ and low κ coupling design which result in an effective length of over 1 m in a sub-mm area. In addition to the C-band (1550 nm) laser demonstrated here, a design using amplifiers at 1310 nm or even visible wavelengths would also be possible due to $Si_3N_4$'s broad transparency. Approaches using heterogeneous bonding rather than edge coupling are also compatible with this novel cavity architecture. Other adjustment in cavity parameters may enable sub-Hz linewidths on a $Si_3N_4$ platform, which may otherwise be far beyond the reach of silicon.

Figure 6:
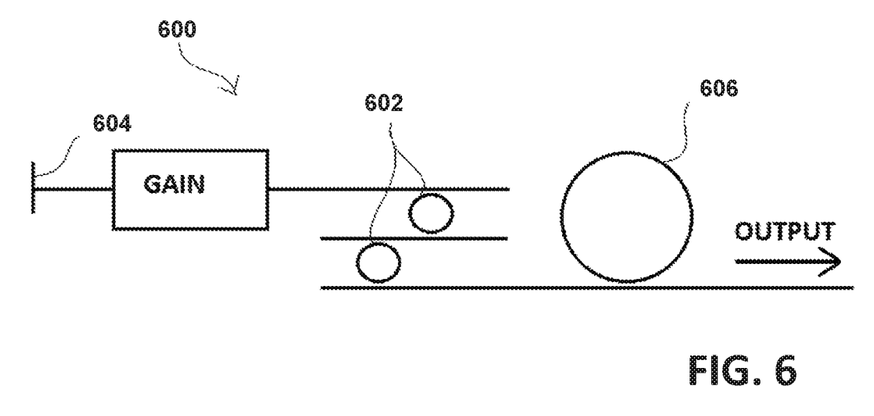
FIG. 6 is a diagram of an integrated laser including multiple additional filter rings, according to another embodiment of the present disclosure.
Figure 7:
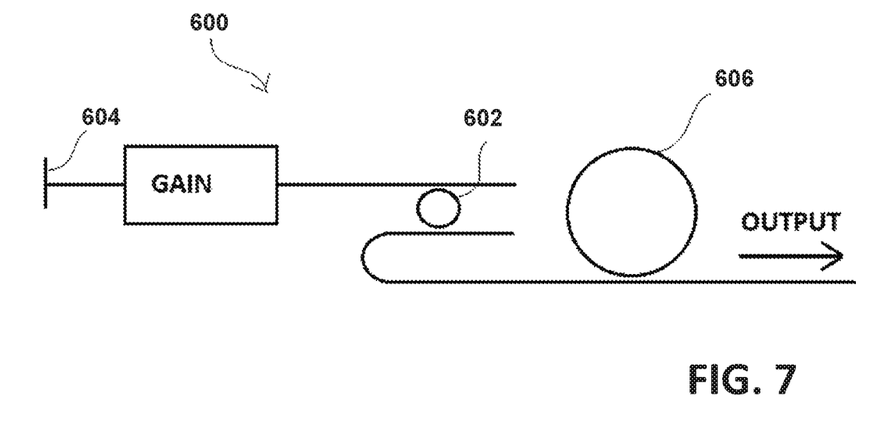
FIG. 7 is a diagram of an integrated laser including an additional filter ring, according to another embodiment of the present disclosure.

FIG. 6 is a diagram of an integrated laser including multiple additional filter rings, according to another embodiment of the present disclosure. FIG. 7 is a diagram of an integrated laser including an additional filter ring, according to another embodiment of the present disclosure. Referring now to FIG. 6 and FIG. 7, an integrated laser 600 can include one or more filter rings 602 in the cavity. In this manner, single-mode lasing may be better ensured, and wavelength tunability may improve. The filter ring(s) 602 may be situated between the mirror 604 and the resonator 606 (e.g., micro-ring reflector) and may be placed in an add-drop configuration. The ring(s) 602 may form a Vernier effect with each other or with the resonator 606 (e.g., high-Q) such that their free spectral ranges (FSRs) are slightly different (e.g. 10 nm and 9 nm) and their resonances only line up at certain multiples of the FSR. The difference in FSR should in general be on the order of or greater than the filter resonance bandwidth. The filter rings 602 may have a smaller radius so that the FSR is larger to accommodate a larger tuning range. This gives a well-defined, large wavelength tuning range. By further suppressing other cavity modes, there can be expected lower relative intensity noise and lower susceptibility to mode hopping. The FSR is set by the radius in typical cases, so if two rings are used they would have different radii. Alternately, the widths may be different but with the same radius, for example. If the FSRs are not sufficiently different, there is a risk that the resonances would be too broad and they would essentially overlap at multiple adjacent resonances, therefore not accomplishing the filtering of the Vernier effect. The filter(s) may have relatively low Q for a large resonance linewidth.

It is to be appreciated that embodiments where the resonator (e.g., or micro-ring) substantially reflects and the other mirror acts as the output coupler (i.e., transmitting and reflecting) are also within the scope of the present disclosure.

Additionally, as used herein, the term "mirror" does not require a metal coating, but can include periodic structures with dimensions to cause reflection (DBR), or a Sagnac loop.

It should be noted that the illustrations and descriptions of the embodiments shown in the figures are for exemplary purposes only, and should not be construed limiting the disclosure. One skilled in the art will appreciate that the present disclosure contemplates various embodiments. Additionally, it should be understood that the concepts described above with the above-described embodiments may be employed alone or in combination with any of the other embodiments described above. It should further be appreciated that the various alternative embodiments described above with respect to one illustrated embodiment can apply to other, and possibly all, embodiments as described herein, unless otherwise indicated. Also, the present invention is not intended to be limited by any description of drawbacks or problems with any prior art device.

It should be understood that the steps of exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments.

Exemplary Embodiments

The following embodiments are illustrative only and do not serve to limit the scope of the present disclosure.

Embodiment 1. An on-chip laser, comprising: a gain portion; a mirror in communication with the gain portion; a waveguide in communication with the gain portion; a resonator optically coupled to the waveguide at an optical coupling, the resonator having a circular shape and optionally having a radius of about 1 centimeter or less, wherein the waveguide and the resonator are separate from the gain portion.

Embodiment 2. The on-chip laser of embodiment 1, wherein the waveguide, the resonator, and the optical coupling are collectively configured so that the resonator outputs a first portion of laser light and reflects a second portion of laser light back to the gain portion through the waveguide.

Embodiment 3. The on-chip laser of any of embodiments 1-2, wherein the coupling strength between the waveguide and the resonator is less than a critical coupling strength.

Embodiment 4. The on-chip laser of any of embodiments 1-2, wherein the coupling strength between the waveguide and the resonator is substantially equivalent to or greater than the critical coupling strength.

Embodiment 5. The on-chip laser of any of embodiments 1-4, wherein the waveguide is a single waveguide, and the single waveguide is the only waveguide optically coupled to the resonator.

Embodiment 6. The on-chip laser of any of embodiments 1-5, wherein the optical coupling is a first optical coupling, the waveguide defines a second optical coupling with the gain portion, the waveguide further defining a pathway length between the first and second optical couplings, and optionally the pathway length is in the range of about 10 micrometers and about 1.0 centimeters.

Embodiment 7. The on-chip laser of any of embodiments 1-6, wherein the circular shape of the resonator is one of a disk and a toroid.

Embodiment 8. The on-chip laser of any of embodiments 1-6, wherein the resonator is a micro-ring resonator.

Embodiment 9. The on-chip laser of embodiment 8, wherein at least a portion, and optionally a majority, of one or both of the waveguide and the micro-ring resonator has a cross-section defined by a width and a thickness, wherein the width is in the range of about 400 nanometers and about 5 micrometers, and the thickness is in the range of about 10 nanometers and about 5 micrometers.

Embodiment 10. The on-chip laser of any of embodiments 1-9, wherein the waveguide and the resonator are separated from each other at the first optical coupling by a gap in the range of about 100 nanometers and about 1000 nanometers.

Embodiment 11. The on-chip laser of any of embodiments 1-10, wherein the gain portion is contained on a first chip portion, the first chip portion comprising a Group III-V reflective semiconductor material. The semiconductor material may be bonded, epitaxially grown, or hybridly attached, to a silicon chip. The semiconductor material may comprise indium phosphide, gallium arsenide, gallium nitride, gallium phosphide, and/or the like. The semiconductor material may comprise a reflective semiconductor optical amplifier (RSOA).

Embodiment 12. The on-chip laser of any of embodiments 1-11, wherein the waveguide and the resonator are contained on a second chip portion separate from the first chip portion.

Embodiment 13. The on-chip laser of embodiment 12, wherein the first and second chip portions are edge-coupled to each other.

Embodiment 14. The on-chip laser of embodiment 12, wherein the one of the first and second chip portions overlies the other of the first and second chip portions.

Embodiment 15. The on-chip laser of embodiment 14, further comprising a grating coupler flip-chip bonding the first and second chip portions together.

Embodiment 16. The on-chip laser of any of embodiments 1-15, wherein the resonator comprises one or more of $Si_3N_4$, $SiO_2$, and substantially pure Si.

Embodiment 17. The on-chip laser of any of embodiments 1-16, wherein the waveguide and the resonator each comprise $Si_3N_4$.

Embodiment 18. The on-chip laser of any of embodiments 1-6 and 8-17, wherein the resonator defines a top surface that is substantially planar.

Embodiment 19. The on-chip laser of any of embodiments 1-18, further comprising one or more heaters adjacent one or both of the waveguide and the resonator, wherein the one or more heaters are configured to thermally tune the one or both of the waveguide and the resonator.

Embodiment 20. The on-chip laser of embodiment 19, wherein the on-chip laser is thermally tunable by the one or more heaters, optionally such that the on-chip laser outputs laser light at tunable wavelengths across a range up to about 80 nanometers.

Embodiment 21. The on-chip laser of any of embodiments 1-20, wherein the on-chip laser outputs laser light having a linewidth between about 100 Hz and about 100 kHz.

Embodiment 22. A microchip, comprising: a laser having a laser cavity layer overlying or underlying a gain layer, wherein the laser cavity layer and the gain layer are substantially distinct layers, the gain layer including a mirror, the laser cavity layer including: a waveguide in communication with the gain layer; and a resonator optically coupled to the waveguide at an optical coupling, the resonator having a circular shape.

Embodiment 23. The micro-chip of embodiment 22, wherein the resonator has a radius of about 1 centimeter or less.

Embodiment 24. The micro-chip of any of embodiments 22-23, wherein the waveguide, the resonator, and the optical coupling are collectively configured so that the resonator outputs a first portion of laser light and reflects a second portion of laser light back to the gain layer through the waveguide.

Embodiment 25. The micro-chip of any of embodiments 22-24, wherein the coupling strength between the waveguide and the resonator is one of less than, substantially equivalent to, and greater than, a critical coupling strength.

Embodiment 26. The micro-chip of any of embodiments 22-25, wherein the optical coupling is a first optical coupling, the waveguide defines a second optical coupling with the gain layer, the waveguide further defining a pathway length between the first and second optical couplings, and the pathway length is in the range of about 10 micrometers and about 1.0 centimeters.

Embodiment 27. The micro-chip of any of embodiments 22-26, wherein the circular shape of the resonator is one of a disk and a toroid.

Embodiment 28. The micro-chip of any of embodiments 22-26, wherein the resonator is a micro-ring resonator.

Embodiment 29. The micro-chip of embodiment 28, wherein at least a portion, and optionally a majority, of one or both of the waveguide and the micro-ring resonator has a cross-section defined by a width and a thickness, wherein the width is in the range of about 400 nanometers and about 5 micrometers, and the thickness is in the range of about 10 nanometers and about 5 micrometers.

Embodiment 30. The micro-chip of any of embodiments 22-29, wherein the waveguide and the resonator are separated from each other at the optical coupling by a gap in the range of about 100 nanometers and about 1000 nanometers.

Embodiment 31. The micro-chip of any of embodiments 22-30, wherein the gain layer comprises a Group III-V reflective semiconductor material. The semiconductor material may be bonded, epitaxially grown, or hybridly attached, to a silicon chip. The semiconductor material may comprise indium phosphide, gallium arsenide, gallium nitride, gallium phosphide, and/or the like. The semiconductor material may comprise a reflective semiconductor optical amplifier (RSOA).

Embodiment 32. The micro-chip of any of embodiments 22-31, wherein the resonator comprises one or more of $Si_3N_4$, SiO2, and substantially pure Si.

Embodiment 33. The micro-chip of embodiment 32, wherein the waveguide and the resonator each comprise $Si_3N_4$.

Embodiment 34. The micro-chip of any of embodiments 22-26 and 28-33, wherein the resonator defines a top surface that is substantially planar.

Embodiment 35. The micro-chip of any of embodiments 22-34, further comprising one or more heaters adjacent one or both of the waveguide and the resonator, wherein the one or more heaters are configured to thermally tune the one or both of the waveguide and the resonator.

Embodiment 36. The micro-chip of embodiment 35, wherein the laser is thermally tunable by the one or more heaters, optionally such that the on-chip laser outputs laser light at tunable wavelengths across a range of up to about 80 nanometers.

Embodiment 37. The micro-chip of any of embodiments 22-36, wherein the laser outputs laser light having a linewidth between about 100 Hz and about 100 kHz.

Embodiment 38. The on-chip laser of any of embodiments 1-21, wherein the resonator is characterized as having a $Q^L$ in the range of about $10^6$ and $10^8$.

Embodiment 39. The on-chip laser of any of embodiments 1-21 and 38, further comprising at least one filter ring that is in communication with the waveguide and is located between the gain portion and the resonator.

Embodiment 40. The micro-chip of any of embodiments 22-37, wherein the resonator is characterized as having a $Q^L$ in the range of about $10^6$ and $10^8$.

Embodiment 41. The micro-chip of any of embodiments 22-37 and 40, further comprising at least one filter ring that is in communication with the waveguide and is located between the gain layer and the resonator.

Embodiment 42. A method, comprising communicating illumination through an on-chip laser according to any of embodiments 1-21, 38, and 39.

Embodiment 43. The method of embodiment 42, further comprising operating the on-chip laser under such conditions that the resonator operates in a pass-by configuration.

Embodiment 44. A method, comprising communicating illumination through an on-chip laser according to any of embodiments 22-37, 40 and 41.

Embodiment 45. The method of embodiment 44, further comprising operating the on-chip laser under such conditions that the resonator operates in a pass-by configuration.

What is claimed:

1. An on-chip laser, comprising:
a gain portion;
a mirror in communication with the gain portion;
a waveguide in communication with the gain portion; and
a resonator optically coupled to the waveguide via only one optical coupling, wherein the waveguide and the resonator are separate from the gain portion, wherein the waveguide is in a pass-by configuration with the resonator such that the optical coupling has only a single optical coupling region between the waveguide and the resonator, wherein the resonator comprises a non-DBR resonator and wherein the waveguide, the resonator, and the optical coupling are collectively configured so that the resonator outputs a first portion of laser light and reflects a second portion of laser light back to the gain portion through the waveguide, the amount of the second portion of laser light reflected sufficient for the resonator to act as an output mirror of the on-chip laser, and collectively configured for operation close to critical coupling wherein the single optical coupling region exhibits low coupling κ.

2. The on-chip laser of claim 1, wherein the resonator has a circular shape, and wherein the circular shape of the resonator is one of a disk and a toroid.

3. The on-chip laser of claim 1, wherein at least a portion of one or both of the waveguide and the resonator has a cross-section defined by a width and a thickness, wherein the width is in the range of about 400 nanometers and about 5 micrometers, and the thickness is in the range of about 10 nanometers and about 5 micrometers.

4. The on-chip laser of claim 1, wherein the gain portion is contained on a first chip portion.

5. The on-chip laser of claim 4, wherein the waveguide and the resonator are contained on a second chip portion separate from the first chip portion.

6. The on-chip laser of claim 5, wherein the first chip portion comprises a Group III-V reflective semiconductor material.

7. The on-chip laser of claim 5, wherein the one of the first and second chip portions overlies the other of the first and second chip portions.

8. The on-chip laser of claim 7, further comprising a grating coupler flip-chip bonding the first and second chip portions together.

9. The on-chip laser of claim 1, wherein one or more of the waveguide or the resonator comprises one or more of $Si_3N_4$, SiO2, and substantially pure Si.

10. The on-chip laser of claim 1, further comprising one or more heaters adjacent one or more of the waveguide, the on-chip laser, or the resonator, wherein the one or more heaters are configured to thermally tune the one or more of the waveguide, the on-chip laser, or the resonator.

11. The on-chip laser of claim 1, wherein the on-chip laser outputs laser light having a linewidth between about 100 Hz and about 100 kHz.

12. The on-chip laser of claim 1, wherein the resonator is characterized as having a $Q^L$ in the range of about $10^6$ and $10^8$.

13. The on-chip laser of claim 1, further comprising at least one filter ring that is in communication with the waveguide and is located between the gain portion and the resonator.

14. A micro-chip, comprising:
a laser having a laser cavity layer overlying or underlying a gain layer, wherein the laser cavity layer and the gain layer are substantially distinct layers, the gain layer including a mirror, the laser cavity layer including:

a waveguide in communication with the gain layer; and a resonator optically coupled to the waveguide via only one optical coupling, wherein the waveguide is in a pass-by configuration with the resonator such that the optical coupling has only a single optical coupling region between the waveguide and the resonator, wherein the resonator comprises a non-DBR resonator and wherein the waveguide, the resonator, and the optical coupling are collectively configured so that the resonator outputs a first portion of laser light and reflects a second portion of laser light back to the gain layer through the waveguide, the amount of the second portion of laser light reflected sufficient for the resonator to act as an output mirror of the laser, and collectively configured for operation close to critical coupling wherein the single optical coupling region exhibits low coupling κ.

15. The micro-chip of claim 14, wherein the optical coupling is a first optical coupling, the waveguide defines a second optical coupling with the gain layer, the waveguide further defining a pathway length between the first and second optical couplings, and the pathway length is in the range of about 10 micrometers and about 1.0 centimeters.

16. The micro-chip of claim 14, wherein at least a portion of one or both of the waveguide and the resonator has a cross-section defined by a width and a thickness, wherein the width is in the range of about 400 nanometers and about 5 micrometers, and the thickness is in the range of about 10 nanometers and about 5 micrometers.

17. The micro-chip of claim 14, wherein the one or more of the waveguide or the resonator comprises one or more of Si3N4, SiO2, and substantially pure Si.

18. The micro-chip of claim 14, further comprising one or more heaters adjacent one or more of the waveguide, the laser, or the resonator, wherein the one or more heaters are configured to thermally tune the one or more of the waveguide, the laser or the resonator.

19. The micro-chip of claim 14, wherein the resonator is characterized as having a $Q^L$ in the range of about $10^6$ and $10^8$.

* * * * *